United States Patent
Chiu et al.

(10) Patent No.: US 6,950,999 B2
(45) Date of Patent: Sep. 27, 2005

(54) CIRCUITRY CROSS-TALK ANALYSIS WITH CONSIDERATION OF SIGNAL TRANSITIONS

(75) Inventors: You-Ming Chiu, Taipei Hsien (TW); Wen-Hao Hsueh, Taipei Hsien (TW)

(73) Assignee: VIA Technologies Inc., Hsin-Tien (TW)

(*) Notice: Subject to any disclaimer, the term of this patent is extended or adjusted under 35 U.S.C. 154(b) by 0 days.

(21) Appl. No.: 10/248,964

(22) Filed: Mar. 6, 2003

(65) Prior Publication Data

US 2003/0217342 A1 Nov. 20, 2003

Related U.S. Application Data

(60) Provisional application No. 60/380,929, filed on May 17, 2002.

(51) Int. Cl.[7] ................................................ G06F 17/50
(52) U.S. Cl. ................................. 716/4; 716/5; 716/6
(58) Field of Search .................................. 716/4, 5, 6

(56) References Cited

U.S. PATENT DOCUMENTS

| | | | |
|---|---|---|---|
| 5,535,133 A | * | 7/1996 | Petschauer et al. ............ 716/19 |
| 5,596,506 A | | 1/1997 | Petschauer et al. |
| 6,721,930 B2 | * | 4/2004 | Sasaki et al. ................... 716/6 |
| 6,772,403 B1 | | 8/2004 | Sasaki |

FOREIGN PATENT DOCUMENTS

| | | | | |
|---|---|---|---|---|
| JP | 2002092069 A | * | 3/2002 | ........... G06F/17/50 |
| WO | WO 01/82145 A1 | | 11/2001 | |

OTHER PUBLICATIONS

Sicard et al., "Cross–Talk Extraction from Mask Layout", Feb. 1993, IEEE Proceedings, 4th European Conference on Design Automation, pp. 414–418.*

Sasaki et al., "Multi–agressor Relative Window Method for Timing Analysis Including Crosstalk Delay Degradation", May 2000, IProceeding of the IEEE 2000 Custom Integrated Circuits Conference, pp. 495–498.*

Sasaki et al., "Building a Crosstalk Library for Relative Window Methods–Timing Analysis that Includes Crosstalk Delay Degradation", Aug. 2000, IEEE, Proceeding of the second IEEE Asia Pacific Conference on ASICs, pp. 371–374.*

* cited by examiner

*Primary Examiner*—Vuthe Siek
*Assistant Examiner*—Sun James Lin
(74) *Attorney, Agent, or Firm*—Winston Hsu

(57) ABSTRACT

A method for evaluating cross-talk of a circuit and signal degrading due to mutual electric coupling between wires of a circuit. The method includes: simulating the signal transmitting on wires of the circuit during the normal operation of the circuit, and implementing cross-talk analysis of the circuit to modify the analysis according to the signal variation during the practical operation of the circuit in order to evaluate the cross talk on each wire in the circuit.

17 Claims, 5 Drawing Sheets

CIRCUITRY CROSS-TALK ANALYSIS WITH CONSIDERATION OF SIGNAL TRANSITIONS

BACKGROUND OF THE INVENTION

1. Field of the Invention

The present invention provides a method to evaluate a circuitry cross-talk during the practical operation of a circuit for the matching between the analysis result and the cross-talk on each wire in the circuit.

2. Description of the Prior Art

In the highly developed modern information society, an electric circuit used in signal processing and data calculation is the most vital fundamental part of information development. From portable cellular phones, personal digital assistants (PDA), to desktop computers, and network servers, different system demands for electric signal processing and information integration are fulfilled by complex electric circuits. The principal part of modern electric circuits is an integrated circuit manufactured in a wafer manufacturing process. An integrated circuit will be packaged in a chip to be applied in a semiconductor system.

With the advancements of wafer manufacturing processing, circuit layout size of an electric circuit gradually scales down and components integration will increase such that the chip volume will be decreased to further fulfill the demands of a tiny circuit of modern information society. However, as circuit volume is getting much smaller, distance between each component and wires becomes much less, signals transmitted in wires will interrupt each other because of mutual electric coupling effects, and communication quality will deteriorate. Signal interference between wires in a circuit because of mutual electric coupling effects is so-called "cross-talk" effect. To further explain the cause of cross-talk, please refer to FIG. 1. FIG. 1 is a schematic diagram of a conventional circuit 10. In circuit 10, circuit blocks 12A, 12B, 14A, 14B, 16A, 16B, 18A, and 18B are the construct components of circuit 10; each illustrated block represents a plurality of organized logic gates or transistors for performing specified function. Wires L1 to L4 in circuit 10 connect blocks 12A to 12B, 14A to 14B, 16A to 16B, and 18A to 18B, respectively with functions of transmitting electric signals between each electric circuit block.

Since circuit 10 has dense component integration distance between each wire will be very small, such as distance D12 and D23 illustrated in FIG. 1. In present 0.18 $\mu m$ (micron) wafer manufacturing processing, distance between each wire could be less than 1 $\mu m$ wherein mutual electric coupling effects between each wire will increase. Although in circuit 10 the wires L1, L2, L3, and L3 are insulated from each other, between each wire, a capacitor will be formed in an equivalent circuit, which makes wires couple mutually via this equivalent capacitor. As illustrated in FIG. 1, mutual electric coupling effects between L1 and L2 could be represented as an equivalent capacitor C12. Signals transmitted in L1 and L2 will interrupt each other via this equivalent capacitor C12 because of cross-talk effect. The mutual electric coupling effects between L2 and L3 could also be represented as an equivalent capacitor C23 and the mutual electric coupling effect between L4 and L1, L2, and L3 could be represented as a capacitor C14, C24, and C34, respectively. Among them, L1 is much closer to L2, which means that D12 is less than D23, and the parallel portion between L1 and L2 is longer, which means that D0 is longer. This means that the mutual electric coupling effects between L1 and L2 is much larger than that between others.

In order to further explain the effects of mutual electric coupling on a circuit, please refer to FIG. 2A and FIG. 1. FIG. 2A is a time sequence of signals transmitted in different wires. The horizontal axis represents time scale and the vertical axis represents signal potential scale. In an ideal situation, a good electric insulation exists between each wire in circuit 10 and signals transmitted in different wires will not interrupt each other. Wave patterns 20A and 20B illustrated in FIG. 2A represent digital signals transmitted in two different wires, such as L1 and L2 for example, in such an ideal situation. However, in reality, the mutual electric coupling effects between different wires will make signals of two wires interrupt each other and result in cross-talk. The wave pattern 20C illustrated in FIG. 2A represents the real wave pattern of wave pattern 20A, which is influenced by mutual electric coupling effects in circuit 10. From time point t0 to t1, the wave pattern 20A in the wire L1 shall maintain at low potential, but the wave pattern 20B in wire L2 is at high potential in the same time span, which prevents the wave pattern 20A from maintaining its low potential through the mutual electric coupling effects between wires and results in the wave pattern 20C having a slightly increased potential. Similarly, in the period time t1 to t2, the wave pattern of the signal transmitted in L1 shall maintain its high potential such as 20A, but low potential wave pattern 20B in L2 makes the wave pattern of L1 lower its potential through mutual electric coupling effects to become the wave pattern 20C. When the ideal wave pattern 20A in L1 degrades due to the wave pattern 20B, noise margin of the signal in L1 will decrease. As the wave pattern illustrated from time point t0 to t2 in FIG. 2A, there is a potential transition V0 in the ideal wave pattern 20A, but potential transition V1 in the wave pattern 20B is less than V0. If the potential transition V1 is too small or noise is too large, it cannot be determined whether the digital signal is at its high level or low level. Besides, at time point t3, both the wave pattern of L1 and L2 increase to a high potential level, and the wave pattern in L1 will exceed the normal potential level to a much higher level through the mutual electric coupling effects between wires, such as wave pattern 20C, which may result in burning out of the wire L1 for its forcing signal.

Cross-talk effects influence not only signal potential mentioned above, but also time domain expression. Please refer to FIG. 2B. Illustrated in FIG. 2B are time sequence representing different locations in wire L1 and L2. The horizontal axis represents time and the vertical axis represents signal potential. The electric block 12A should transmit signals to the electric block 12B through the wire L1, the electric block 14B should transmit signals to the electric block 14A through the wire L2, the wave pattern 26A, 26B, and 26C represent the wave patterns having potential transitions in locations 22A, 22B and 22C of the wire L2 and the wave pattern 28A, 28B, and 28C represent the wave patterns having potential transitions in locations 24A, 24B and 24C of the wire L2. As illustrated in FIG. 2B, wave pattern 26B has its rising edge at time point t5 and t6, but wave pattern 28B has its falling edge at the same time points. The falling edge of the wave pattern 28B will lower the rising velocity of the rising edge of the wave pattern 26B through mutual electric coupling, which results in a longer time needed for the wave pattern 26B to rise, and influences the potential transition speed of the wave pattern 26C. In other words, unexpected delays will occur in signals transmitted in the wire L1 for a rising edge and a falling edge occurring at the same time in different wires, and each electric block in circuit 10 will not operate concisely according to its default time domain.

Please refer to FIG. 3. In order to decrease cross-talk effects in a circuit due to mutual electric coupling, cross-talk effects of a circuit shall be analyzed specifically during electric circuit design process. FIG. 3 is a schematic diagram of a prior art flow 100 for analyzing cross-talk effects during electric circuit design. The flow 100 is as follows:

Step 102: Circuit Functions Design. According to function demands, needed electric components, such as transistors, or logic gates will be assigned in this step. In other words, in this step transistors or logic gates will be chosen to fulfill the demand for functions of a circuit. In FIG. 1, flow 100 will perform electric circuit design and cross-talk analysis for circuit 10. Circuit 10 is provided with functions of receiving signals A and B in electric circuit blocks 12A and 12B, applying an "AND" operation on signals A and B, inverting the resulting signal and outputting it as signal C; receiving a signal in electric circuit blocks 16A and 16B, buffering and outputting it as signal G with high driving capacity; and receiving a signal H in electric circuit blocks 18a and 18B, inverting the resulting signal and outputting it as signal I. Therefore, as illustrated in an attached graph in FIG. 3, components such as AND gate 30A and inverter 30B will be chosen to achieve the above-mentioned functions in this step.

Step 104: Circuit Layout Design. After determining the component assignment in circuit 10, how to practice the circuit design determined in step 102 with circuit layouts in real wafer manufacturing processing will be considered in this step. To a person having ordinary skills in the art, in wafer manufacturing processing, a doped region (active region), oxide layer, field oxide layer, conductive layer, and polysilicon layer will be applied to layouts of transistors, logic gates, or other components. In this step, square measure of each transistor and logic gate in different layers, layout layer between each transistor and logic gate (use a conductive layer to practice the wire L1 to L3, and another conductive layer to practice the wire LA for example) and the layout width and length illustrated in the attached graph 34 in FIG. 3 will be determined practically, wherein the associated layouts of circuit blocks 12A and 12B is known by those skilled the art without need to be illustrated in the attached graph 34. After circuit layout design, the occupied square measure of each circuit block in circuit 10 and the geometric structure of the wire L1 to L4 have been determined. In order to practice this step in operation, CAD software could be applied to achieve the functional demand for automatic localization and APR, auto placement and routing.

Step 106: Parameters Determination. After circuit layout design in step 104, mutual electric coupling parameters between each wire such as resistance distributed in the circuit and capacity of mutual coupling equivalent capacitors between wires will be calculated according to the layout geometric structure. In wafer manufacturing processing, a square measure unit of each conductive polysilicon, and conductive layer is provided with a certain distributed resistance. After determining the wire layer and geometric structure, distributed resistance of each wire could be calculated. Similarly, the equivalent capacitance of each wire is related to the geometric distance of each wire, which could be calculated in this step. In order to practice this step in operation, resistor and capacitor analysis software, such as STAR_RC, can be applied.

Step 108: Coupling Nets Determination. Parameters determined in step 106 would be applied to make up a coupling net, which is needed for cross-talk analysis. Parameters such as distributed resistance, and mutual coupling capacitance between each wire in circuit 10 shall be determined in order to consider cross-talk effects between wires. After step 106, associated parameters could be determined. As illustrated in an attached graph 38 in FIG. 3, parameters about distributed resistance and mutual coupling equivalent capacitance of the wire L1 to L4 have been determined, and wires in the circuit 10 have been organized to make up a coupling net having resistors and capacitors. After making up the coupling net, mutual electric coupling effects between each wire have to be further analyzed. During a practical operation, this step can be done in step 106 by applying software resistor and capacitor analysis software. Generally, after analysis in step 106 and 108 with the aid of resistor and capacitor analysis software, a plurality of wires with critical mutual electric coupling effects among wires in circuit 10 can be determined and listed. In a more complex circuit, such as one of an application chip, there may be thousands of inter-connected wires between each circuit block, resistor and capacitor analysis software can list a plurality of wires with most critical mutual electric coupling effects just as the circuit designer wishes; for example, the most critical one thousand wires.

Step 110: Cross-Talk Analysis, which could be called SI, signal integrity, analysis Cross-talk effects between wires to signals transmitted in them can be determined according to the coupling net determined in step 108. In prior art, it is the most pessimistic condition being taken into accounts in cross-talk analysis. As illustrated in FIG. 2B, it will be considered in conventional cross-talk analysis that two single reverse transmitted at the same time in the wires L1 and L2 compensate each other completely, which make the delay time of signal transmitted in the wire L1 longest. Alternatively, as illustrated in FIG. 2A, which frequent transitions in both L1 and L2 result in the most critical interruption to signal transmitted in L1. Additionally, there is a potential transition from low to high just in both L1 and L2 such that the mutual coupling influence in the wire L1 is so large so as to have a highest potential in L1. In other words, in a conventional pessimistic cross-talk analysis, each transmitted signal will be considered whether or not generating the most critical cross-talk influences. In a practical operation of this step, signal analysis application software, such as $MDC_{13}SI$, can be applied. As mentioned in step 108, after applying resistor and capacitor analysis software to list a plurality of wires having most critical mutual electric coupling effects, signal analysis application software can be applied to analyze influences of cross-talk of these plural wires. Usually, after analysis in this step, influences of cross-talk to each wire in circuit 10 can be listed for comparison so that the circuit designer is capable of telling which wires in circuit 10 are most intended to be influenced by cross-talk and what the influences are. The circuit designer can rearrange circuit layout according to the analytic result, and go back to step 104 to reduce cross-talk effects of such wires.

Though it is a strictly conservative standard to analyze cross-talk effects of each wire in step 110, to some of wires during a practical operation of circuit 10, the pessimistic condition will not occur. For example, in step 110 the wire L1 is analyzed to be easily influenced by cross L2 such that a frequent potential transition occurs in L2 to influence signal L1 by mutual electric coupling. However, during a practical operation of circuit 10, there may be no frequent transition in L2 because only signals with low frequency or direct current would be transmitted in L2. The transition frequency in unit time is much lower in L2 than L1. In such a condition, the rate in which L2 happens to have mutual compensation or addition coupling in pessimistic condition is very low because frequency differences between the two wires is so large that it is not easy for appearance of transitions synchronization. Cross-talk effects of practical operation of circuit 10 are not as critical as the result analyzed in step 110. It is the coupling net determined in step 108 being taken into accounts to do pessimistic analysis in step 110. The coupling net having only parameters information about coupling capacitance and distributed resistance cannot represent how circuit 10 operates and what kinds of signals are transmitted in each wire. Therefore, in order to get the pessimistic condition that signals happen to compensate or add each other in each wire, an analytic result with stricter standard shall be considered.

To each wire in circuit 10, if during a practical operation of the circuit the analytic pessimistic condition is highly different from real conditions, a cross-talk analysis result will mislead the circuit designer such that the circuit designer could not modify the circuit design correctly. For example, if the cross-talk analysis in step 110 represents that the wire L1 will be influenced seriously by cross-talk of the wire L2, the circuit designer has to return to step 104 from step 110 to redesign circuit layout of L1. However, during a practical operation of the circuit 10, rate of occurrence of the most pessimistic condition that signal transmitted in L1 and L2 synchronized is very rare. In such condition, too serious cross-talk analysis causes an unnecessary layout redesign. Besides the unnecessary waste of time, in modern highly integrated electric circuit design, each element usually interrupts each other, which is called trade-off. Some elements might be compromised in order to redesign the circuit. For example, it may result in signal deterioration while increasing a wire length. Some compromises are unnecessary. Therefore, ignoring signals transmitted during a practical operation of a circuit and strictly analyzing the cross-talk in pessimistic condition may result in unnecessary waste and a compromising circuit design.

SUMMARY OF THE INVENTION

It is therefore a primary objective of the claimed invention to provide a cross-talk analysis method considering a practical operation of a circuit to overcome the problems of the prior art.

In the prior art, cross-talk analysis is evaluated in the most pessimistic condition, which does not consider the real situation of signals transmitted in each wire during a practical operation of a circuit, and may result in incorrect analytic results wasting time on circuit layout redesign.

It is provided to the claimed invention a circuit function simulation process to analyze signals transmitted in each wire in operation to modify the most pessimistic analytic result, If the frequency with two transmitted signals both having potential transition in the same time span is high, the most pessimistic cross-talk analytic result will determine that there is a critical mutual electric coupling between these two wires, which means it is very possible to have cross-talk between these two wires in a practical operation of the circuit. Otherwise, the frequency of potential transition of these two wires is highly different means during a practical operation of the circuit, cross-talk will not influence these two wires much even if the most pessimistic analytic result determines that the cross-talk effects between these two wires are critical. The claimed invention takes use of a circuit function simulation result to reexamine the most pessimistic cross-talk analytic results to determine whether or not the most pessimistic condition occurs during a practical operation of circuit. Without any possible appearance of the most pessimistic condition, there is no demand for circuit redesign, which makes the circuit designer concentrate on wires with high possibility to be influenced by cross-talk. In another preferred embodiment, the circuit functions simulation result could be applied for cross-talk analysis of the most pessimistic condition, which involves applying pessimistic cross-talk analysis to a wire with high frequency of potential transition or ignoring the analytic process to a wire without high frequency of potential transitions in order to accelerate circuit design.

These and other objectives of the claimed invention will no doubt become obvious to those of ordinary skill in the art after reading the following detailed description of the preferred embodiment, which is illustrated in the various figures and drawings.

DETAILED DESCRIPTION OF THE INVENTION

Figure 1:
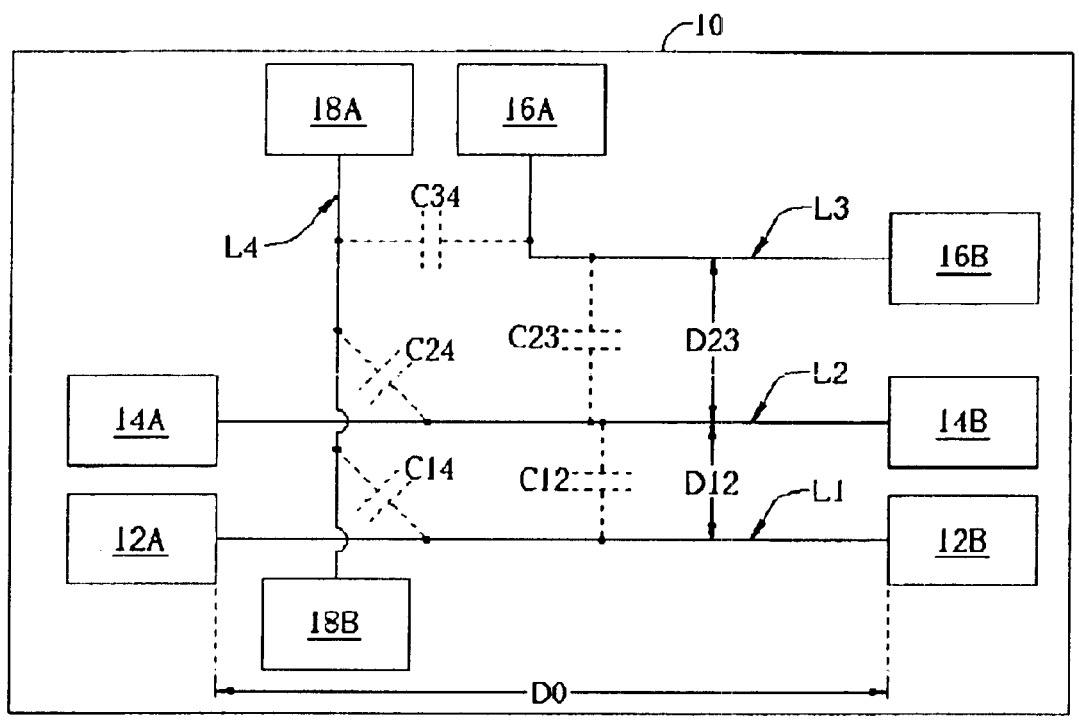
FIG. 1 is a schematic diagram of a conventional circuit.
Figure 2A:
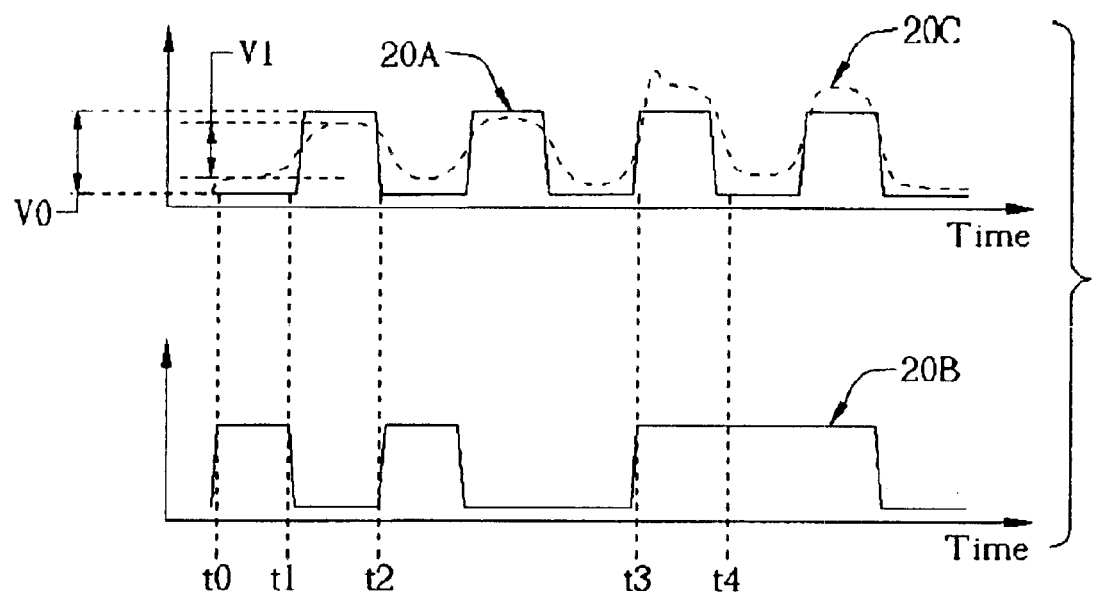
FIGS. 2A and 2B are schematic diagrams illustrating cross-talk effects on signals transmitted in two wires.
Figure 2B:
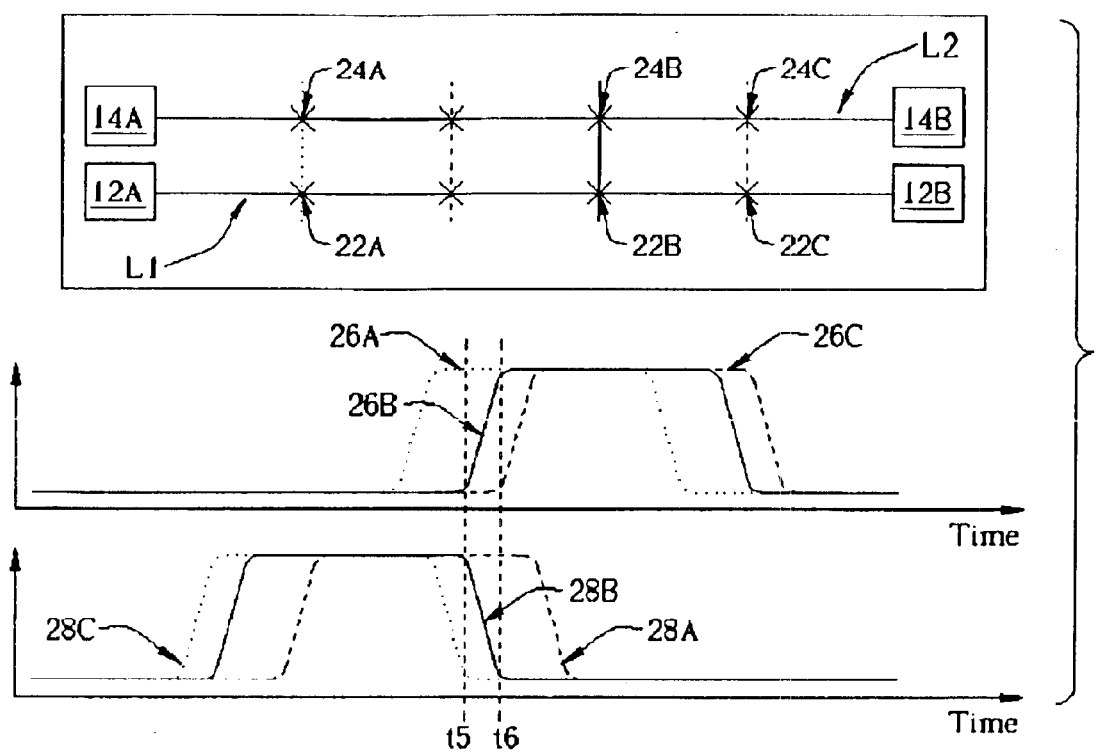
Figure 3:
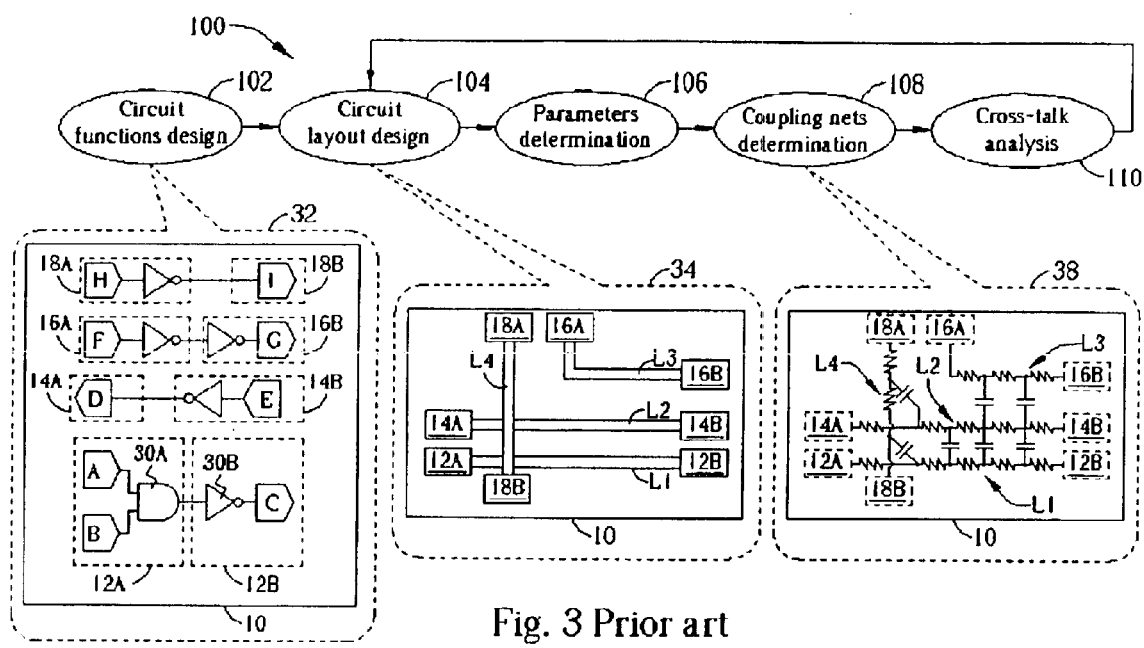
FIG. 3 is a flow chart of a conventional cross-talk analysis.
Figure 4:
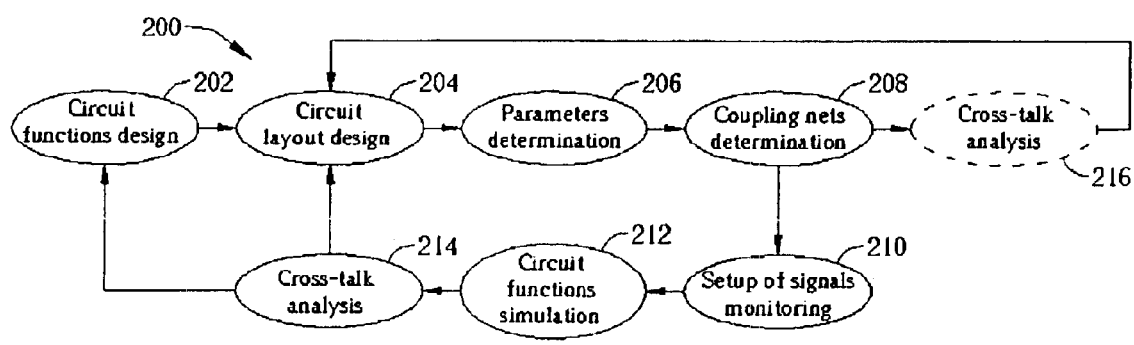
FIG. 4 is a schematic diagram of a cross-talk analysis flowchart according to the present invention.

Please refer to FIG. 4. The flow chart illustrated in FIG. 4 is a present invention cross-talk analysis flow 200. The following is as follows:

Step 202: Circuit Functions Design. Like step 102 illustrated in FIG. 3, components such as transistors and logic gates will be arranged in step 202 to achieve default circuit functions.

Step 204: Circuit Layout Design. Like step 104 illustrated in FIG. 3, circuit wiring and layout of the circuit designed will be determined in step 204. After step 204, a geometric layout structure of wires of the circuit will be determined.

Step 206: Parameters Determination. Like step 106 illustrated in FIG. 3, after step 204, equivalent mutual coupling capacitors and distributed resistors will be calculated according to parameters (such as resistance of each polysilicon and conductive layers) of the geometric layout structure and wafer manufacturing processing.

Step 208: Coupling Nets Determination. Like the relationship between step 106 and step 108, after parameters determination in step 206, the mutual electric coupling effects will be determined and listed according to the determined coupling net. Application software RC can be applied in step 206 and step 208 for determining a plurality of wires having most critical mutual electric coupling effects.

Step 210: Setup of Signals Monitoring. A difference between the present invention and the prior art is that the real condition of a circuit during a practical operation in cross-talk analysis is considered in the present invention. In order to achieve the objective, a plurality of wires with most critical mutual electric coupling effects will be monitored for analyzing the real condition in operation. According to a plurality of wires with most critical mutual coupling effects determined in step 208, the wires, which should be mounted in step 210, could be determined.

Step 212: Circuit Functions Simulation. In this step, circuit functions during a practical operation will be simulated in cooperation with monitored wires set up in step 210 to monitor and analyze the real condition of signals transmitted in wires in operation. In a practical operation, circuit functions simulation application software can be applied in step 210 and step 212. For example, in digital circuit design, simulation software called Verilog can be applied to simulate each input and output signal of logic gates in circuit operation, and a plug-in of Verilog can be applied in step 210 in cooperation with Verilog to point out the simulated results Verilog monitoring.

Step 214: Cross-Talk Analysis. In an embodiment of the present invention, cross-talk analysis of this step can apply the most pessimistic cross-talk analysis discussed in step 110 to list a plurality of wires with most critical mutual electric coupling effects, and analyze the influences of the wires in a most pessimistic condition. The present invention can further reexamine the most pessimistic or similar condition according to the signal transmitted simulation results in step 212, and determine whether or not the most pessimistic condition will occur in a practical operation of a circuit. If the simulation results in step 212 determine that potential transitions occur frequently in a certain two wires during practical operation of a circuit or potential transitions occur synchronized in these two wires, signal transmitted conditions of these two wires is very similar to the most pessimistic condition and cross-talk effects analyzed in the most pessimistic cross-talk analysis would be very similar to what really happens during a practical operation of the circuit. Otherwise, if the simulated results in step 212 determine that the potential frequency of dynamic signals of some two wires is highly different during a practical operation of a circuit or it is not easy to have rising or falling edges synchronized, which is different from the most pessimistic condition, cross-talk effects between these two wires will not be critical. After reexamination of cross-talk analysis results determined in step 210 and step 212 in the present invention, the circuit designer could concentrate on wires with critical cross-talk effects in operation and not on wires without possibility. In another preferred embodiment, this step can perform pessimistic cross-talk analysis on wires having frequent potential transitions, which are determined in step 210 and step 212. In other words, a plurality of wires with frequent potential transitions and a high possibility to have the most pessimistic conditions may be listed in step 210 and step 212 and analyzed for pessimistic cross-talk conditions in this step. No matter which embodiment mentioned above is used, the present invention aided by the simulated results determined in step 210 and step 212 can represent practical cross-talk effects. A circuit designer can go back to step 202 of step 204 according to these cross-talk analysis results to modify circuit design or layout.

Besides steps 202, 204, 206, 208, 210, 212, and 214, the present invention flow 200 can still apply some steps of the prior art flow 100 to do cross-talk analysis of step 216 after performing step 206. The cross-talk analysis of step 216 is basically the same as that of step 110. After step 216, step 204 can be applied for circuit layout redesign. Since it is considered the practical operation condition of a circuit according to circuit functions in steps 210, 212, and 214 of the present invention, a circuit designer can go back to step 202 to redesign circuits in order to further design circuits in the component level, which makes it more flexible to design function and circuits to reduce cross-talk effects.

In the prior art, the real signal transmitted condition during practical operation of a circuit will not be considered in analysis and evaluation of cross-talk. The most pessimistic cross-talk analysis of a circuit does not represent the real cross-talk effects in operation, and may result in unnecessary circuit redesign and time waste. On the contrary, the real signal transmitted conditions is being taken into consideration in the present invention, which makes a circuit designer concentrate on wires actually containing critical cross-talk effects during operation, which avoids unnecessary waste and performs better on design to modify circuit functions and layout at the same time.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for reducing cross-talk effects of a circuit between signals transmitted in a first wire and a second wire, the method comprising:

according to circuit functions, analyzing potential transition frequency of signals transmitted in the first wire and the second wire during the practical operation of the circuit to generate a first analytic result, wherein the signals transmitted in the first and second wires of the circuit are a first dynamic signal and a second dynamic signal, respectively;

according to layouts of the first and second wires, while a first signal and a second signal are respectively transmitted substantially under pessimistic condition on the first wire and the second wire, analyzing mutual influence effects between the first signal and the second signal to generate a second analytic result;

generating a third analytic result according to a difference between the first analytic result and the second analytic result; and modifying the layouts of the first and second wires only when the third analytic result is less than a predetermined threshold.

2. The method of claim 1, wherein when the potential transition frequency of the first and the second dynamic signals is larger, it determines that the second analytic result is correct.

3. The method of claim 1, wherein when a potential transition frequency of the first and second dynamic signals is lower, the mutual influence effects between the first and the second wires according to the second analytic result is reduced.

4. The method of claim 1, further comprising altering the layouts of the first and the second wires according to the third analytic result.

5. The method of claim 1, wherein the mutual influence effects between the first and second signals are larger than that between the first and the second dynamic signals.

6. The method of claim 1, further comprising calculating the difference between the first and the second dynamic signals to monitor potential transition of the first and the second wires.

7. The method of claim 1, further comprising setting up the first and the second signals such that a potential transition of the transmitted signal between the first and second wires is maximized.

8. The method of claim 1, further comprising determining whether or not to modify the layouts of the first and the second wires according to the third analytic result.

9. A method for reducing cross-talk of a circuit between signals transmitted in a first wire and a second wire, the method comprising:

according to circuit functions, analyzing signals transmitted in the first and the second wires under operating conditions to generate a first analytic result, wherein the signals transmitted in the first and second wires of the circuit are a first dynamic signal and a second dynamic signal, respectively;

according to analysis of the first and the second dynamic signals, while a first and second signal are transmitted substantially under pessimistic condition in the first and second wires, respectively, further analyzing the mutual influence effects between the first and second signals according to layouts of the first and the second wires to generate a second analytic result; and modifying the layouts of the first and second wires only when a difference between the first analytic result and the second analytic result is less than a predetermined threshold.

10. The method of claim 9, wherein during analysis of the first and the second dynamic signals, if a potential transition between the first and the second dynamic signals is less than a default value, analyzing the mutual influence effects between the first and the second signals according to layouts of the first and the second wires is not permitted.

11. The method of claim 9, further comprising altering the layouts of the first and the second wires according to the second analytic result.

12. The method of claim 9, wherein the mutual influence effects between the first and the second signals is larger than that between the first and second dynamic signals.

13. A method for reducing cross-talk of a circuit between first and second wires, the method comprising:

according to circuit functions, analyzing a first dynamic signal which is transmitted in the first wire and a second dynamic signal which is transmitted in the second wire during operation of the circuit to generate a first result;

simulating a situation using a computer in which a first and second signals are transmitted substantially under pessimistic condition in the first and the second wires respectively, to determine the mutual influence effects between the first and the second wires and generate a second result; and according to analysis of the first and the second dynamic signals, modifying circuit design only when a difference between the first result and the second result.

14. The method of claim 13, wherein when a potential transition frequency of the first and the second dynamic signals is larger, the circuit layout design is modified according to the mutual influence.

15. The method of claim 13, wherein when a potential transition frequency of the first and second dynamic signals is lower, the circuit layout design is not modified according to the mutual influence.

16. The method of claim 13, wherein the first and the second signals are signals that generate maximum cross-talk effects on the first and second wires in the circuit.

17. The method of claim 13, wherein a computer simulates a situation wherein the first and the second signals are transmitted in the first and second wires respectively, so as to calculate a resistance and a capacitance of the first and the second wires to determine a coupling net and to calculate cross-talk effects between the first and the second signals of the coupling net.

* * * * *